(12) United States Patent
Sugino et al.

(10) Patent No.: US 12,057,317 B2
(45) Date of Patent: Aug. 6, 2024

(54) CONDUCTIVE LAYERS IN MEMORY ARRAY REGION AND METHODS FOR FORMING THE SAME

(71) Applicant: Micron Technology, Inc., Boise, ID (US)

(72) Inventors: Kenichi Sugino, Hiroshima (JP); Mitsunari Sukekawa, Hiroshima (JP); Yasutaka Iuchi, Hiroshima (JP); Keisuke Shimada, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 462 days.

(21) Appl. No.: 17/379,794

(22) Filed: Jul. 19, 2021

(65) Prior Publication Data

US 2023/0017813 A1   Jan. 19, 2023

(51) Int. Cl.
*H01L 21/285* (2006.01)
*H10B 12/00* (2023.01)

(52) U.S. Cl.
CPC ....... *H01L 21/2855* (2013.01); *H10B 12/485* (2023.02); *H10B 12/488* (2023.02)

(58) Field of Classification Search
CPC . H01L 21/2855; H10B 12/485; H10B 12/488; H10B 12/09
See application file for complete search history.

(56) References Cited

U.S. PATENT DOCUMENTS

| | | | |
|---|---|---|---|
| 10,468,457 B1* | 11/2019 | Zeng | H10N 50/80 |
| 2009/0309134 A1* | 12/2009 | Nishio | H01L 29/66462 |
| | | | 257/E21.403 |
| 2010/0246152 A1* | 9/2010 | Lin | H01L 23/481 |
| | | | 361/783 |
| 2021/0391532 A1* | 12/2021 | Yin | H10B 61/22 |

* cited by examiner

*Primary Examiner* — Mohammed R Alam
(74) *Attorney, Agent, or Firm* — Dorsey & Whitney LLP (57) ABSTRACT

Apparatuses and methods for manufacturing semiconductor memory devices are described. An example method includes: forming a conductive layer and sputtering the conductive layer with gas. The conductive layer includes a first portion having a top surface having a first height; and a second portion having a top surface having a second height lower than the first height. Sputtering the conductive layer with gas may be performed to remove the first portion of the conductive layer and increase the second height of the second portion of the conductive layer concurrently.

21 Claims, 10 Drawing Sheets

CONDUCTIVE LAYERS IN MEMORY ARRAY REGION AND METHODS FOR FORMING THE SAME

BACKGROUND

High data reliability, high speed of memory access, lower power consumption and reduced chip size are features that are demanded from semiconductor memory. To reduce chip size, a distance between memory cells becomes shorter.

Semiconductor devices include conductive layers, such as bit lines and redistribution layers (RDLs). An RDL refers to an interconnect layer that is used to redistribute terminals for a package with solder bumps and flip chip connections, for example. The RDLs provide signals on input/output pads of the devices to other locations. The RDLs are often disposed in an uppermost part of the semiconductor devices. The RDLs tend to be formed thick to have a low resistance.

Conventional methods of forming RDLs include dry etching metal films using hard masks to isolate adjacent RDLs. However, hard mask pattern misalignments or variations of thickness of the RDLs tend to cause a short circuit of adjacent RDLs, particularly because of a relatively short distance between an upper layer of one RDL and a lower layer of an adjacent RDL.

DETAILED DESCRIPTION

Various embodiments of the present disclosure will be explained below in detail with reference to the accompanying drawings. The following detailed description refers to the accompanying drawings that show, by way of illustration, specific aspects and embodiments in which the present disclosure may be practiced. These embodiments are described in sufficient detail to enable those skilled in the art to practice the present disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

The following describes methods of forming apparatuses, such as semiconductor memory devices, including conductive layers according to the embodiment with reference to FIG. 1 to FIG. 14. The dimensions and the ratios of dimensions of each portion in each drawing do not necessarily coincide with the dimensions and the ratios of dimensions of the actual semiconductor device.

Figure 1:
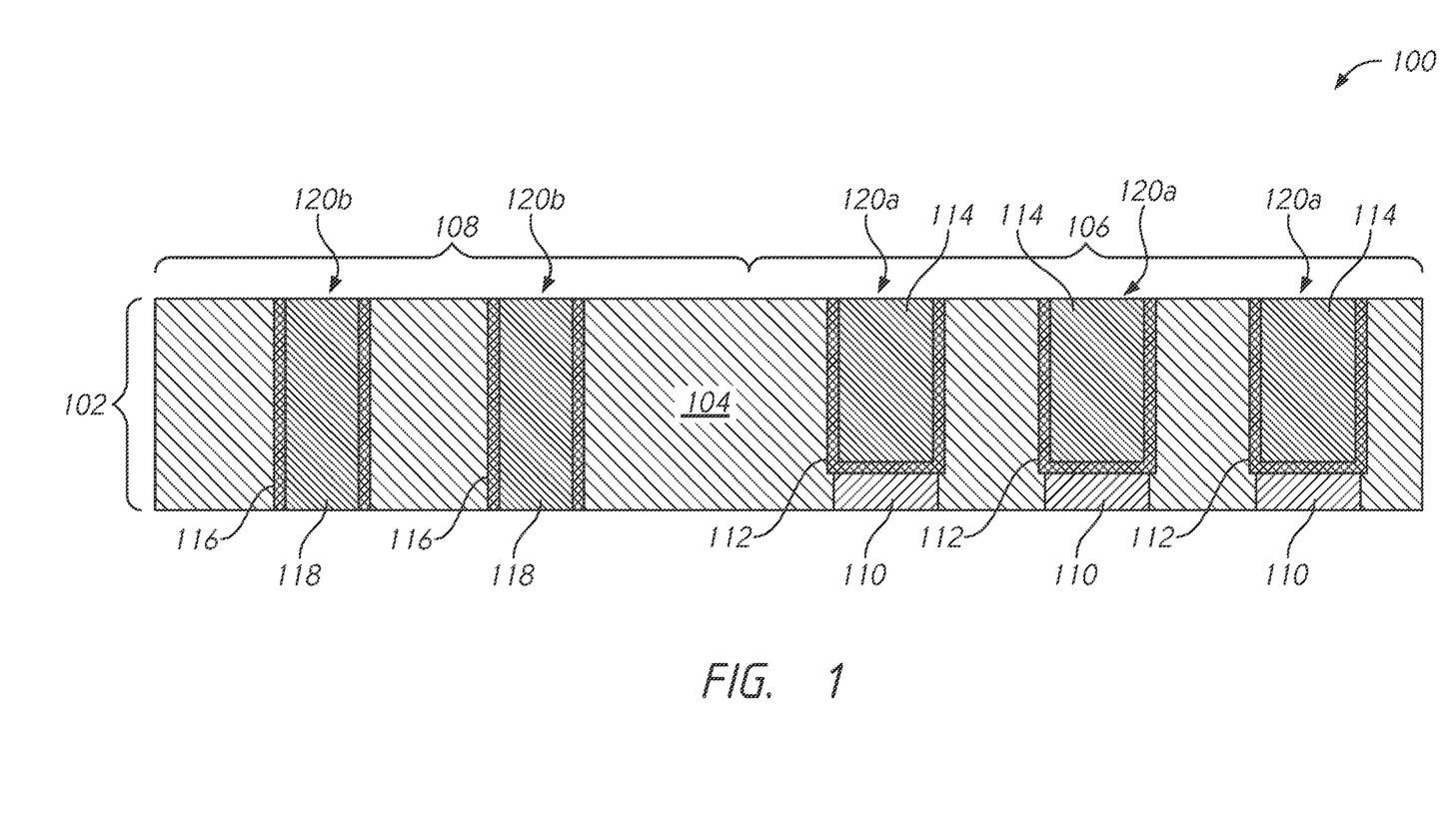
FIG. 1 is a diagram of a vertical cross-sectional view of one schematic structure of a portion of a semiconductor device in accordance with an embodiment of the present disclosure.

In some embodiments, conductive layers may be redistribution layers (RDLs). FIG. 1 is a diagram of a vertical cross-sectional view of one schematic structure of a portion 102 of a semiconductor device 100 in accordance with an embodiment of the present disclosure. The portion 102 may include a memory cell array region 106 and a peripheral region 108. Memory cells may be disposed in the memory cell array region 106 and peripheral circuits may be disposed in the peripheral region 108. In some embodiments, the portion 102 may be above a substrate (not shown). The portion 102 may include a dielectric layer 104 (e.g., a dielectric film) disposed across the memory cell array region 106 and the peripheral region 108. The portion 102 may include interconnects 114 and 118 in the memory cell array region 106 and the peripheral region 108 of the dielectric layer 104, respectively.

In some embodiments, the interconnects 114 and 118 may be formed in openings using a damascene process. In some embodiments, the dielectric layer 104 may be formed on one or more dielectric layers (not shown) stacked on the substrate. In some embodiments, the dielectric layer 104 may include dielectric material. The dielectric material may include, for example, silicon nitride (SiN). Openings 120a and 120b may be formed in the memory cell array region 106 and the peripheral region 108 of the dielectric layer 104 respectively. In some embodiments, the openings 120a and 120b may be formed using photopatterning and dry-etching. In the openings 120a, conductive contacts 110 may be formed. In some embodiments, the conductive contacts 110 may be above interconnects to memory cell elements (not shown). The conductive contacts 110 may include conductive material. The conductive material may include, for example, polycrystalline silicon (poly-Si).

The portion 102 may include barrier layers 112 and 116 in the memory cell array region 106 and the peripheral region 108, respectively. The barrier layers 112 and 116 may be formed in the openings 120a and 120b, respectively. In some embodiments, the barrier layers 112 may be formed on the conductive contacts 110. In some embodiments, the barrier layers 112 and 116 may be deposited concurrently by physical vapor deposition (PVD), such as sputtering. The portion 102 may include the interconnects 114 on the barrier layers 112 in the openings 120a. The portion 102 may also include the interconnects 118 on the barrier layers 116 in the openings 120b. In some embodiments, the interconnects 114 and 118 may be deposited by physical vapor deposition (PVD), sputtering the conductive material. Alternatively, the interconnects 114 and 118 may be deposited by chemical vapor deposition (CVD). The interconnects 114 and 118 may include conductive material. In some embodiments, the conductive material may include at least one of tungsten (W), titanium (Ti) or titanium nitride (TiN). After depositing the conductive material, excess conductive material above a top surface of the portion 102 may be removed by planarization, such as chemical mechanical polishing (CMP). Thus, the interconnects 114 and 118 may be formed in the dielectric layer 104.

Figure 2:
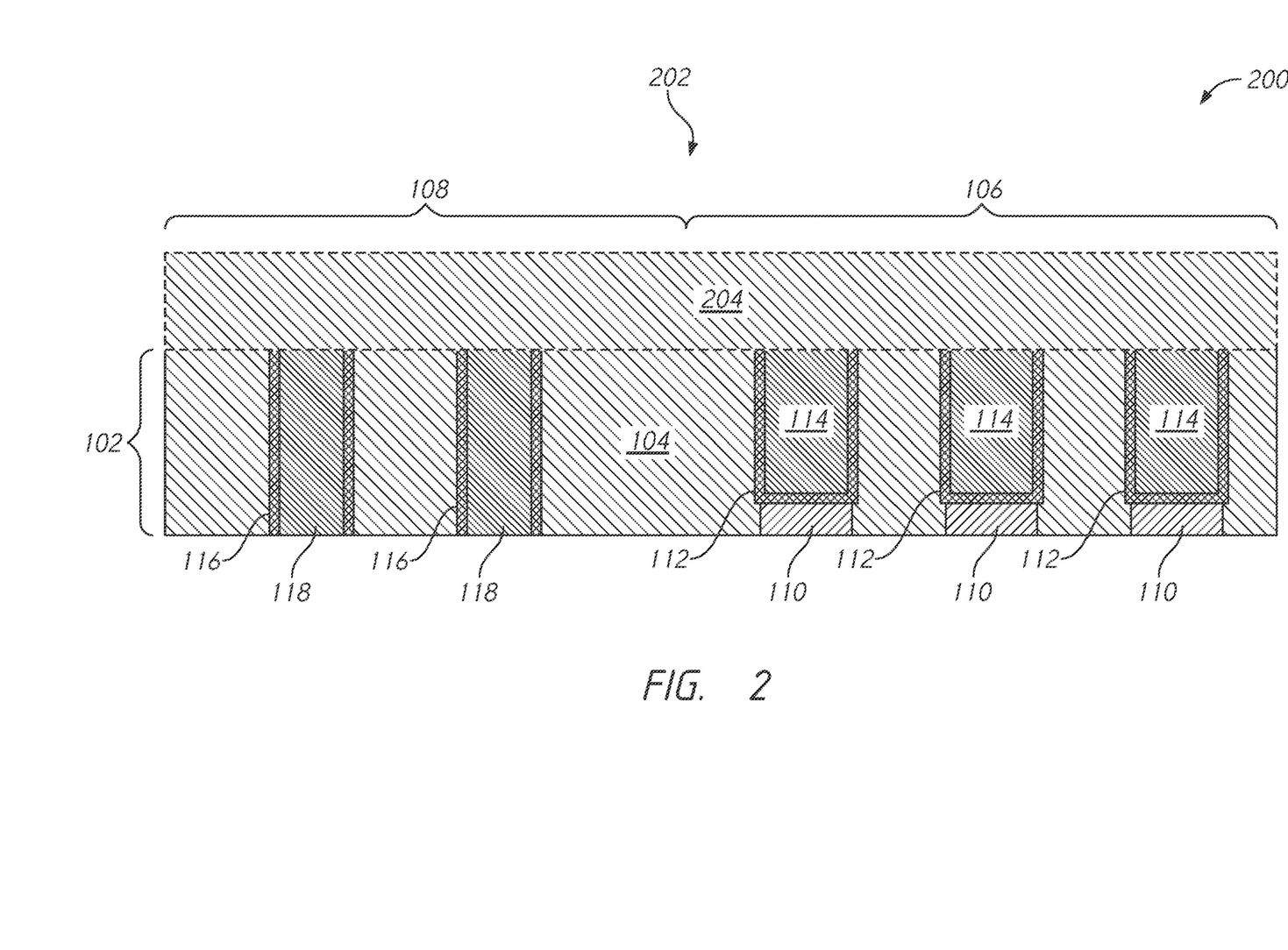
FIG. 2 is a diagram of a vertical cross-sectional view of one schematic structure of a portion of a semiconductor device in accordance with an embodiment of the present disclosure.

FIG. 2 is a diagram of a vertical cross-sectional view of one schematic structure of a portion 202 of a semiconductor device 200 in accordance with an embodiment of the present disclosure. The portion 202 may further include dielectric layer 204 (e.g., a dielectric film) formed on the portion 102 of FIG. 1. In some embodiments, the dielectric layer 204 may include dielectric material. The dielectric material may include, for example, silicon nitride (SiN).

Figure 3:
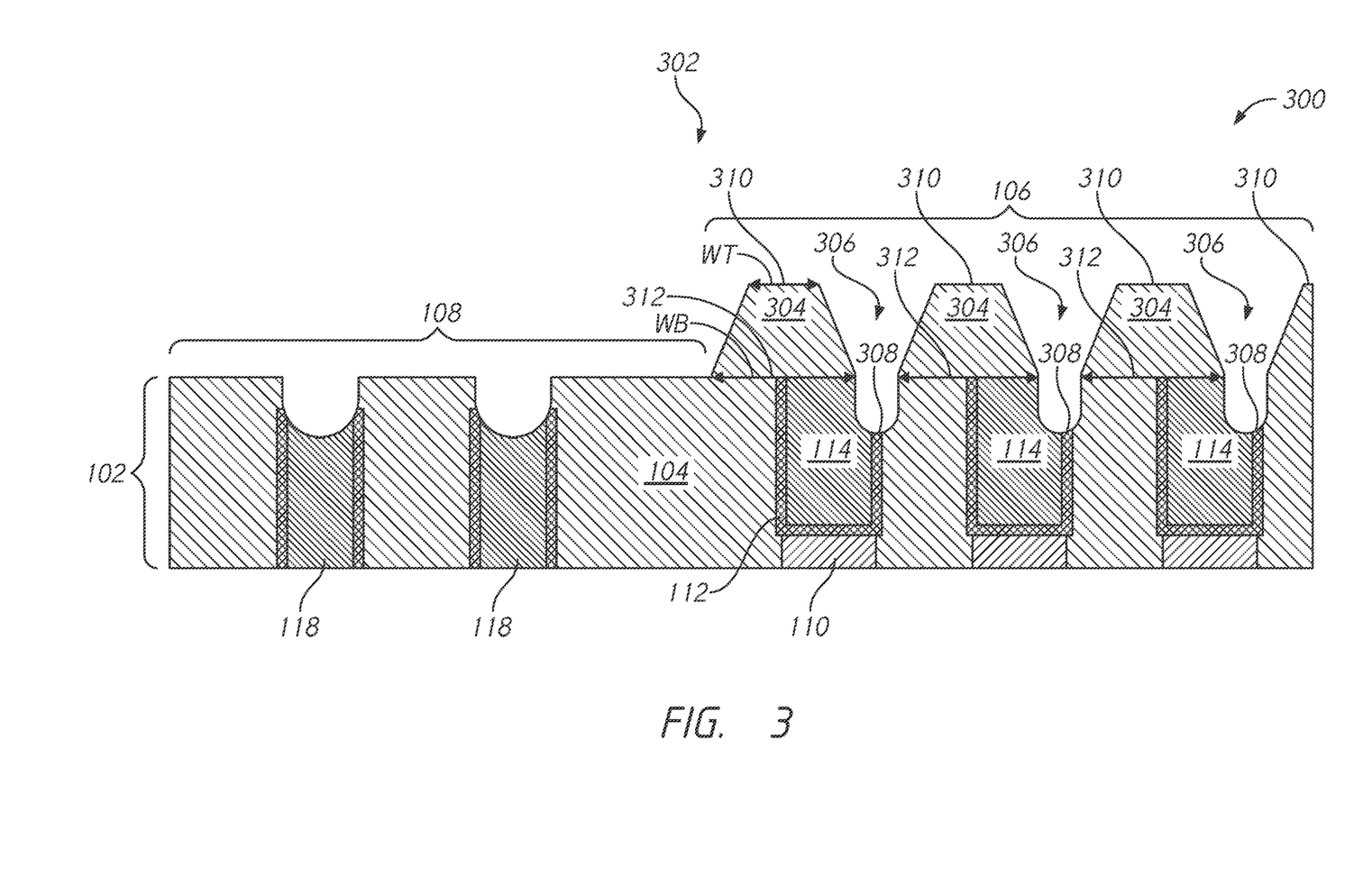
FIG. 3 is a diagram of a vertical cross-sectional view of one schematic structure of a portion of a semiconductor device in accordance with an embodiment of the present disclosure.

FIG. 3 is a diagram of a vertical cross-sectional view of one schematic structure of a portion 302 of a semiconductor device 300 in accordance with an embodiment of the present disclosure. The portion 302 may include openings 306 and dielectric structures 304 in the memory cell array region 106. Portions of the dielectric layer 204 are removed to provide the openings 306 and dielectric structures 304. Each opening 306 may be disposed between adjacent dielectric structures 304. Each dielectric structure 304 of the one or more dielectric structures 304 may include a top face 310 and a base 312. In some embodiments, the base 312 may have a dimension WB that is larger than a dimension WT of the top face. The base 312 of each dielectric structure 304 may cover a portion of a top surface of each corresponding interconnect 114 and a portion of a top surface of the dielectric layer 104. Thus, each dielectric structure 304 together with the dielectric layer 104 may insulate adjacent interconnects 114.

The one or more dielectric structures 304 may be formed by the following process. Portions of the dielectric layer 204 in FIG. 2 may be removed over the memory cell array region 106. The conductive contacts 114 are exposed in the memory cell array region 106. For example, to form the openings 306, portions of the dielectric layers 204 in the memory cell array region 106 may be removed. The portions of the dielectric layers 204 may be removed at edges 308 of the conductive contacts 114 and/or barrier layer 112 (for example, a right side in FIG. 3) of the conductive contacts 114. Some portions of the dielectric layers 104 and some portions of the conductive contacts 114 may be removed by further etching the openings 306 at the edges 308 of the conductive contact 114 and/or barrier layer 112. By further etching, the conductive contacts 114 may be exposed to a greater extent. Thus, the one or more dielectric structures 304 may be separately disposed in the memory cell array region 106, with the openings 306 between adjacent dielectric structures 304 of the one or more dielectric structures 304.

Portions of the dielectric layer 204 in FIG. 2 may also be removed over the peripheral region 108. In some embodiments, the dielectric layer 204 in the peripheral region 108 may be removed by etching. The interconnects 118 are exposed to a greater extent in the peripheral region 108. In some embodiments, removing portions of the dielectric layer 204 in the memory cell array region 106 and removing portions of the dielectric layer 204 in the peripheral region 108 may be performed concurrently. In some embodiments, the portions of the conductive contacts 114 and 118 may be removed concurrently.

Figure 4:
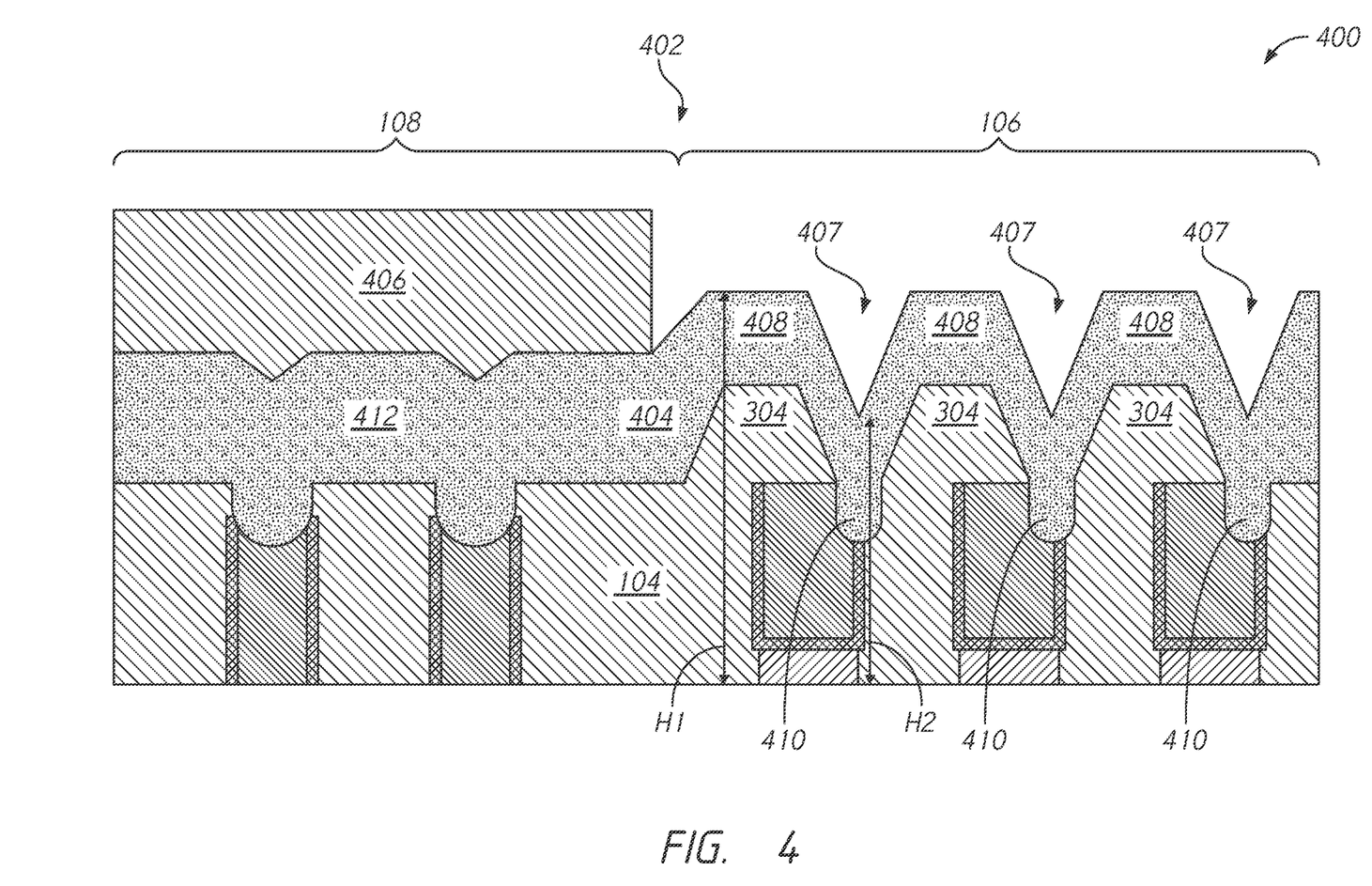
FIG. 4 is a diagram of a vertical cross-sectional view of one schematic structure of a portion of a semiconductor device in accordance with an embodiment of the present disclosure.

FIG. 4 is a diagram of a vertical cross-sectional view of one schematic structure of a portion 402 of a semiconductor device 400 in accordance with an embodiment of the present disclosure. The portion 402 includes a conductive layer 404 disposed on the portion 302 and a dielectric layer 406 disposed on the conductive layer 404 in the peripheral region 108. The conductive layer 404 may include portions 408 and 410 in the memory cell array region 106. In some embodiments, the portions 408 may be disposed on above the dielectric structures 304 and the portions 410 may be disposed in the openings 306. Top surfaces of the portions 408 may have a height H1 from the bottom of the portion 402. Top surface of the portions 410 may have a height H2 less than the height H1 from the bottom of the portion 402. The conductive layer 404 may also include a portion 412 in the peripheral region 108. The dielectric layer 406 may be formed on the portion 412. The conductive layer 404 may fill the recesses 407 in the peripheral region 108 with conductive material.

In some embodiments, the conductive layer 404 may be deposited by physical vapor deposition (PVD), for example, sputtering the conductive material. In some embodiments, the conductive layer 404 may be deposited by chemical vapor deposition (CVD). In some embodiments, the conductive layer 404 may include conductive material, such as ruthenium (Ru). In some embodiments, the dielectric layer 406 may include dielectric material. The dielectric material may include, for example, silicon nitride (SiN).

Figure 5:
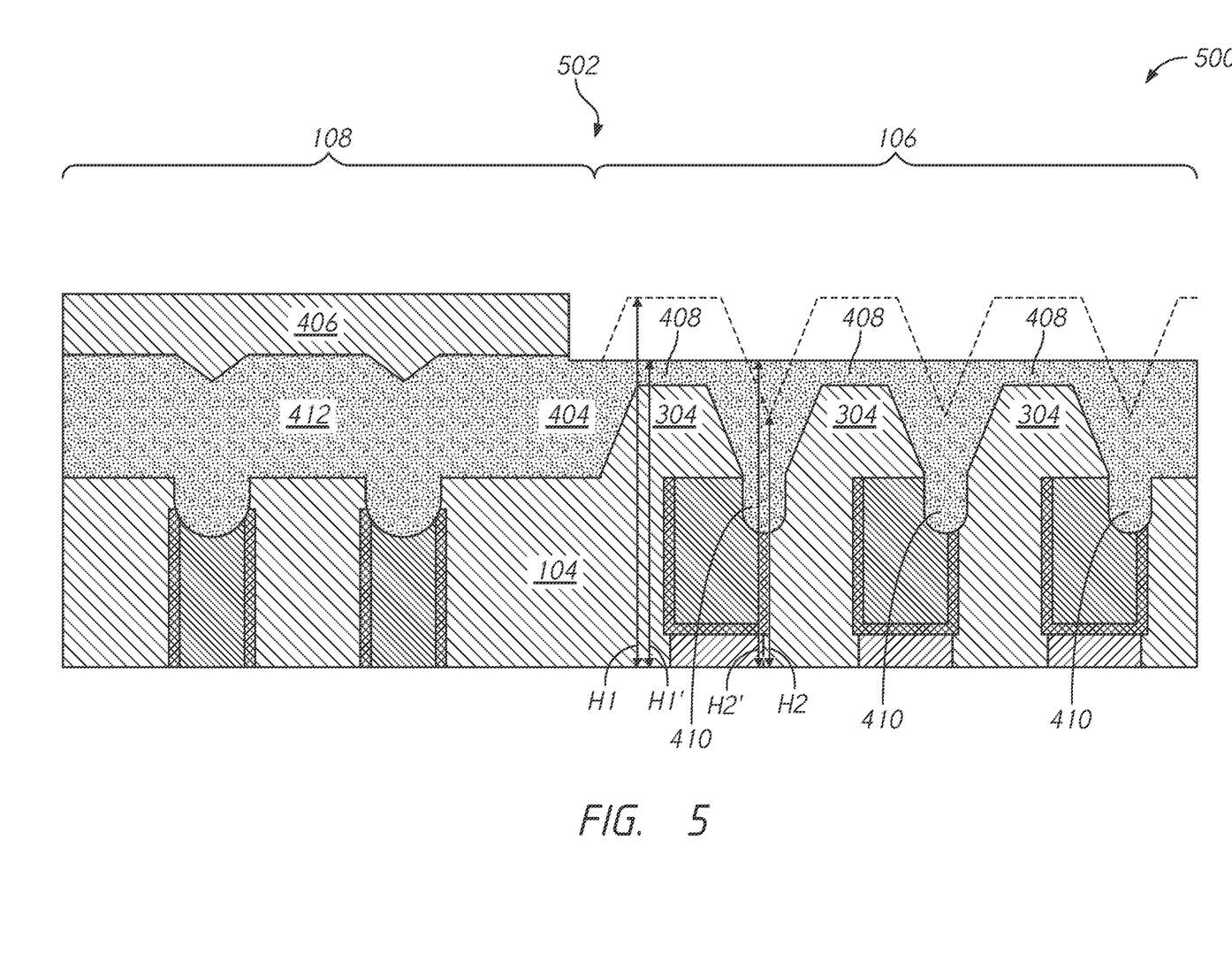
FIG. 5 is a diagram of a vertical cross-sectional view of one schematic structure of a portion of a semiconductor device in accordance with an embodiment of the present disclosure.

FIG. 5 is a diagram of a vertical cross-sectional view of one schematic structure of a portion 502 of a semiconductor device 500 in accordance with an embodiment of the present disclosure. A sputtering process may be performed on the portion 502. In some embodiments, sputtering the portion 502 may be performed using an inert gas, such as argon (Ar). Top portion of portions 408 of the conductive layer 404 may be removed and the openings 306 above the portions 410 of the conductive layer 404 may be filled with removed conductive material from the portions 408 concurrently by sputtering the conductive layer 404. Top surfaces of the portions 408 have a height H1' that is less than H1 and top surfaces of the portions 410 may have a height H2' that is greater than H2. Thus, unevenness of a top surface of the conductive layer 404 in the memory cell array region 106 may be reduced. In some embodiments, the height H1' of the portions 408 and the height H2' of the portions 410 may have the same height.

In some embodiments, the gas used for sputtering may further include another gas for removing a top portion of the dielectric layer 406 as well as a top portion the conductive layer 404. For example, the other gas may be oxygen (O2) gas for etching. Thus, a top portion of the conductive layer 406 may be further removed by etching. In some embodiments, a ratio of the argon gas and the oxygen gas may be adjusted to control removing the top portion of the dielectric layer 406, and the portions 408 of the conductive layer 404 and filling the recesses 407 to increase the height of the top surfaces of the portions 410 of the conductive layer 404. Thus, the top portion of the conductive layer 404 and the top portion of the dielectric layer 406 may be further removed while the portions 410 of the conductive layer 404 may be increased.

Figure 6:
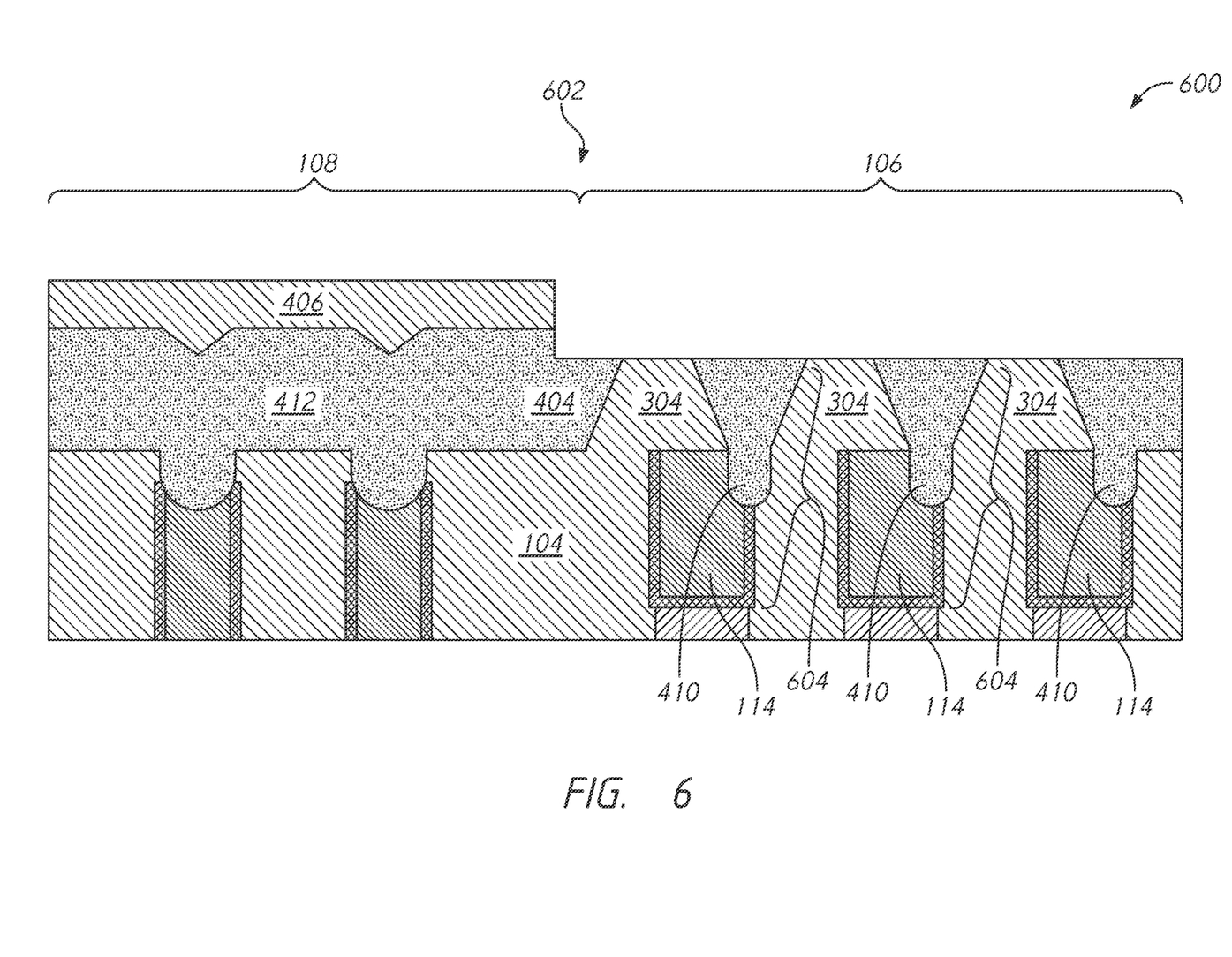
FIG. 6 is a diagram of a vertical cross-sectional view of one schematic structure of a portion of a semiconductor device in accordance with an embodiment of the present disclosure.

FIG. 6 is a diagram of a vertical cross-sectional view of one schematic structure of a portion 602 of a semiconductor device 600 in accordance with an embodiment of the present disclosure. Sputtering the conductive layer 404 and etching a top portion of the portion 602 may be continuously performed using gas until the portions 408 may be removed and top faces of the dielectric structures 304 may be exposed. The gas may include at least the argon (Ar). The gas may also include oxygen (O2). The portion 602 may include redistribution layers (RDLs) 604. Each RDL 604 of the RDLs 604 may include each interconnect 114 and the portion 410 of the conductive layers 404 on the corresponding interconnect 114 being filled after sputtering the conductivities layer 404. Each RDL 604 may be insulated from adjacent RDLs by adjacent dielectric structures 304 between the RDL 604 and the adjacent RDLs 604.

As described above, the RDLs 604 may be disposed between the dielectric structures 304, thus, insulation between the RDLs 604 may be assured. Sputtering the conductive layer 404 including conductive material, such as ruthenium, removes the portion 408 of the conductive layer 404 having a greater height H1 and concurrently fills the recess above the portion 410 of the conductive layer 404 with the conductive material from the removed portion 408. Thus, unevenness of an upper surface of the portion 602 in the memory cell array region 106 may be reduced.

Figure 7:
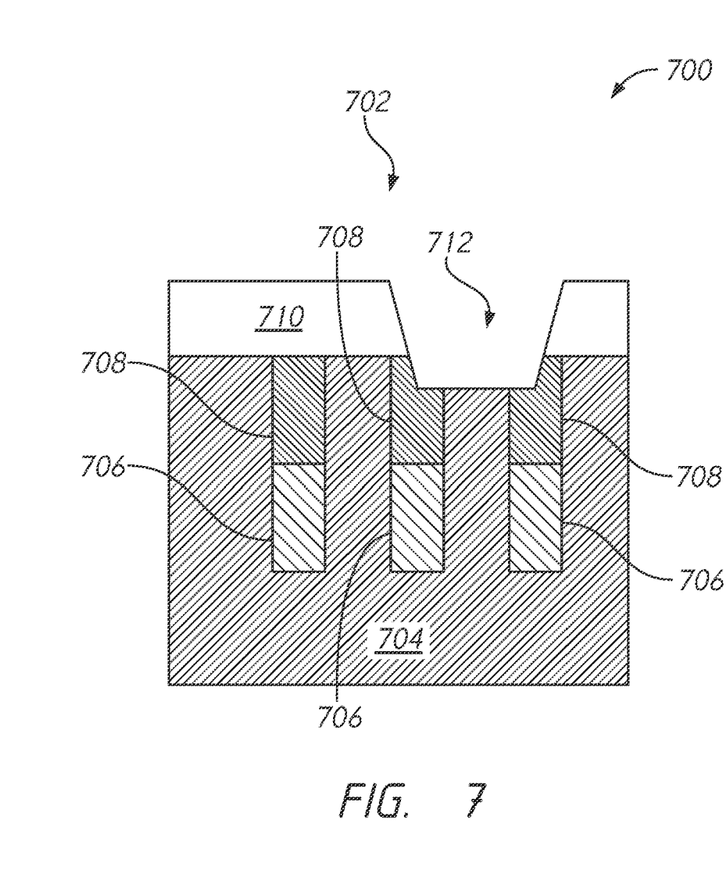
FIG. 7 is a diagram of a vertical cross-sectional view of one schematic structure of a portion of a semiconductor device in accordance with an embodiment of the present disclosure.

In some embodiments, conductive layers may be bit lines. FIG. 7 is a diagram of a vertical cross-sectional view of one schematic structure of a portion 702 of a semiconductor device 700 in accordance with an embodiment of the present disclosure. In some embodiments, the portion 702 may be disposed in a memory cell array region (not shown) in the semiconductor device 700. The portion 702 may include an active region of a substrate 704. In some embodiments, the substrate 704 may include a single-crystal silicon, for example. In the following description, above is oriented with the substrate 704 at a bottom of the portion 702.

The portion 702 may include a plurality of word lines 706 disposed in the active region of the substrate 704. In some embodiments, the plurality of word lines 706 may be formed by etching the substrate 704 to create openings, such as trenches, and forming the plurality of word lines 706 by depositing a conductive material by PVD, such as sputtering, or by CVD. In some embodiments, the conductive material may be titanium nitride (TiN). In some embodiments, the openings are filled with conductive material until a middle height of the opening, without filling to the top of the openings. In some embodiments, the portion 702 may include dielectric layers 708 above the word lines 706. In some embodiments, the dielectric layers 708 may include dielectric material, such as silicon nitride (SiN). The dielectric layers 708 may be deposited by filling the openings above the word lines 706 to the top of the openings. After forming the dielectric layers 708, a top surface of the substrate 704 and the dielectric layers 708 may be planarized by the CMP. The portion 702 may further include a dielectric layer 710 formed above the substrate 704 and the dielectric layers 708. After forming the dielectric layer 710, a portion of the dielectric layer 710 above portions of adjacent dielectric layers 708 above adjacent word lines 706 and the substrate 704 between the portions of the adjacent dielectric layers 708 may be removed by etching to form an opening 712. The etching may be continued to further remove top portions of the adjacent dielectric layers 708 and a top portion of the substrate 704 between the top portions of the adjacent dielectric layers 708. Thus the opening 712 may be created into and through the dielectric layers 704 and 710.

Figure 8:
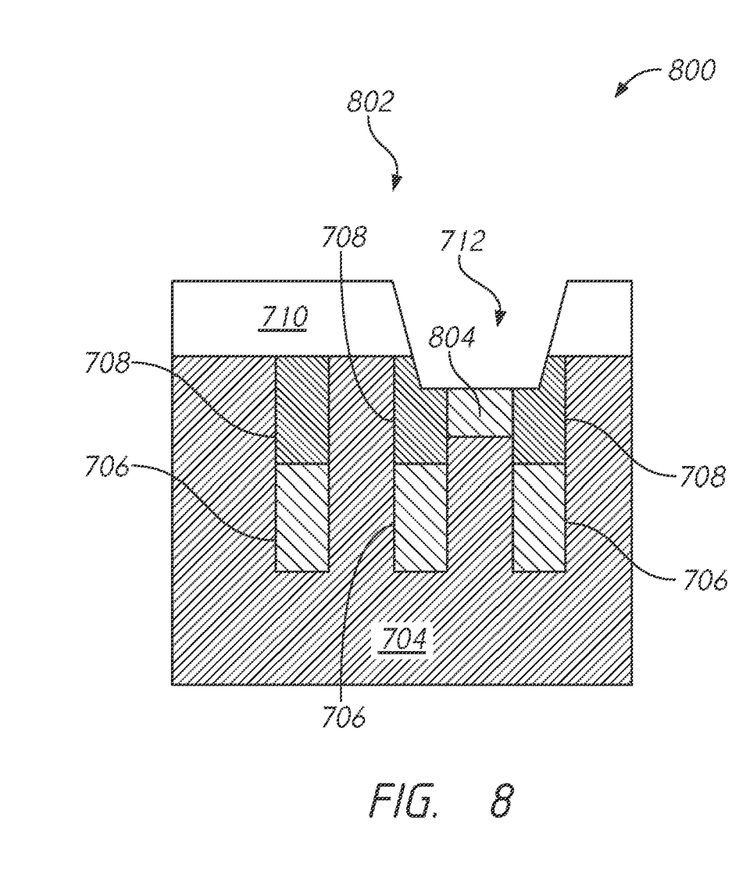
FIG. 8 is a diagram of a vertical cross-sectional view of one schematic structure of a portion of a semiconductor device in accordance with an embodiment of the present disclosure.

FIG. 8 is a diagram of a vertical cross-sectional view of one schematic structure of a portion 802 of a semiconductor device 800 in accordance with an embodiment of the present disclosure. In some embodiments, the portion 802 may include a bit line contact 804 at a bottom of the opening 712 and above the substrate 704. In some embodiments, the bit line contact 804 may be disposed on the substrate 704. The bit line contact 804 may include conductive barrier material, such as titanium nitride (TiN) and/or titanium (Ti). The bit line contact 804 may be disposed between adjacent dielectric layers 708. Thus the bit line contact 804 may be insulated from the word lines 706. In some embodiments, a bottom of the bit line contact 804 may be above a top of the word line 706 and bottom of the dielectric layer 708.

Figure 9:
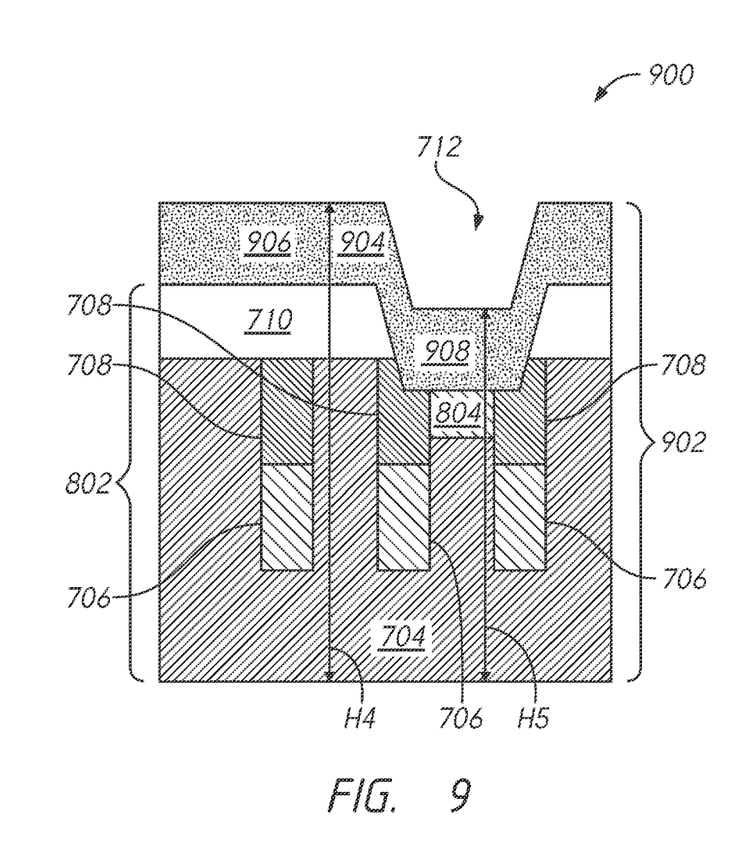
FIG. 9 is a diagram of a vertical cross-sectional view of one schematic structure of a portion of a semiconductor device in accordance with an embodiment of the present disclosure.

FIG. 9 is a diagram of a vertical cross-sectional view of one schematic structure of a portion 902 of a semiconductor device 900 in accordance with an embodiment of the present disclosure. In some embodiments, the portion 902 may include a conductive layer 904 disposed on the portion 802. The conductive layer 904 may include portions 906 and 908. In some embodiments, the portion 906 may be disposed on the dielectric layer 710 and the portion 908 may be disposed in the opening 712 in the dielectric layer 710 and above the bit line contact 804. A top surface of the portion 906 may have a height H4 from the bottom of the portion 802. A top surface of the portion 908 may have a height H5 less than the height H4 from the bottom of the portion 802.

In some embodiments, the conductive layer 904 may be deposited by physical vapor deposition (PVD), sputtering the conductive material. Alternatively, the conductive layer 904 may be deposited by chemical vapor deposition (CVD). In some embodiments, the conductive layer 904 may include conductive material, such as ruthenium (Ru).

Figure 10:
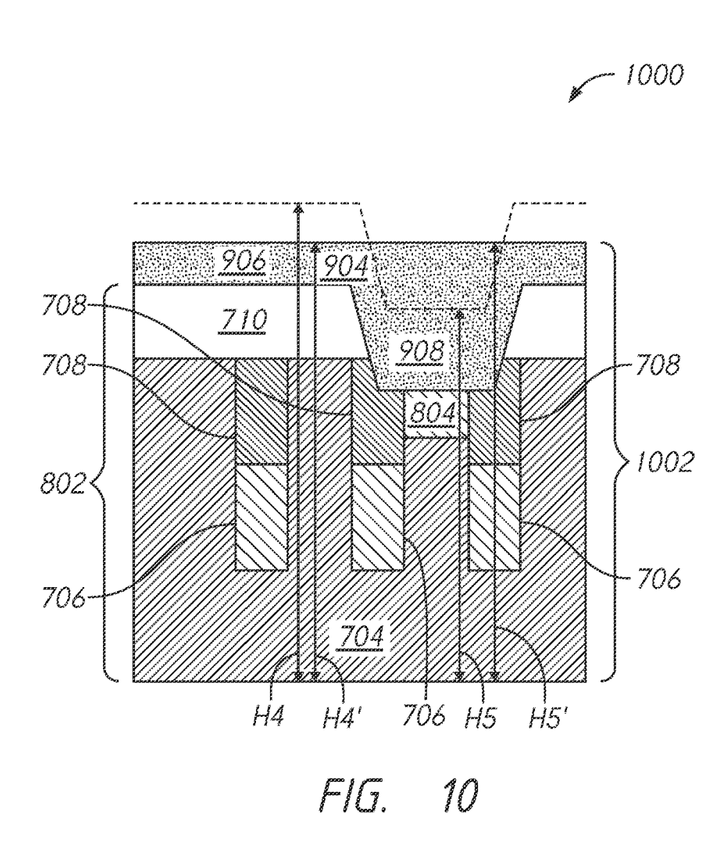
FIG. 10 is a diagram of a vertical cross-sectional view of one schematic structure of a portion of a semiconductor device in accordance with an embodiment of the present disclosure.

FIG. 10 is a diagram of a vertical cross-sectional view of one schematic structure of a portion 1002 of a semiconductor device 1000 in accordance with an embodiment of the present disclosure. Sputtering the conductive layer 904 may be performed. In some embodiments, sputtering the conductive layer 904 may be performed using inert gas, such as argon (Ar). A top portion of portion 906 of the conductive layer 904 may be removed and the opening 712 above the portion 908 of the conductive layer 404 may be concurrently filled with conductive material from the portion 906 by sputtering the conductive layer 904. A top surface of the portion 906 may have a height H4' that is less than height H4 and a top surface of the top surface of the portion 908 may have a height H5' that is greater than H5. Thus, unevenness of a top surface of the conductive layer 904 may be reduced.

In some embodiments, top surfaces of the portions 906 and 908 may have a same height.

In some embodiments, the gas used for sputtering may further include another gas for further etching the conductive layer 904. For example, the other gas may be oxygen (02) gas. Thus, a top portion of the conductive layer 904 may be further removed by etching.

Figure 11:
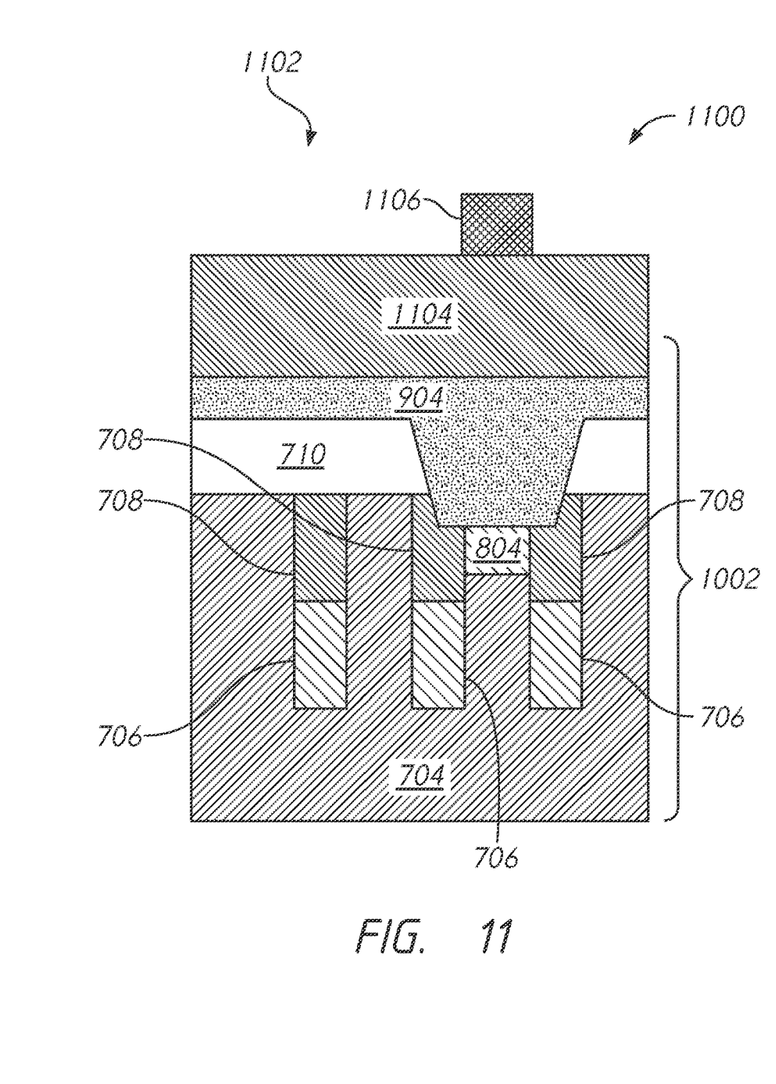
FIG. 11 is a diagram of a vertical cross-sectional view of one schematic structure of a portion of a semiconductor device in accordance with an embodiment of the present disclosure.

FIG. 11 is a diagram of a vertical cross-sectional view of one schematic structure of a portion 1102 of a semiconductor device 1100 in accordance with an embodiment of the present disclosure. The portion 1102 may include a dielectric layer 1104 formed on the conductive layer 904. In some embodiments, the dielectric layer 1104 may include silicon nitride (SiN). Photographic processes can be used to provide a hardmask from the dielectric layer 1104. For example, using a lithography, a mask, such as a photoresist 1106 may be disposed in a pattern of a bit line that covers the dielectric layer 1104 above the bit line contact 804. The photoresist may not cover the dielectric layer 1104 other than an area above the bit line contact 804, which may be exposed for etching. Etching may be dry etching or wet etching, for example. In some embodiments, dry etching may be performed until the etching is stopped by the dielectric layer 710 and dielectric layers 708. Thus, the dielectric layer 1104 and the conductive layer 904 not covered by the photoresist 1106 may be removed. In post-etching process (e.g., dry ashing and wet cleansing), the photoresist 1106 may be removed.

Figure 12:
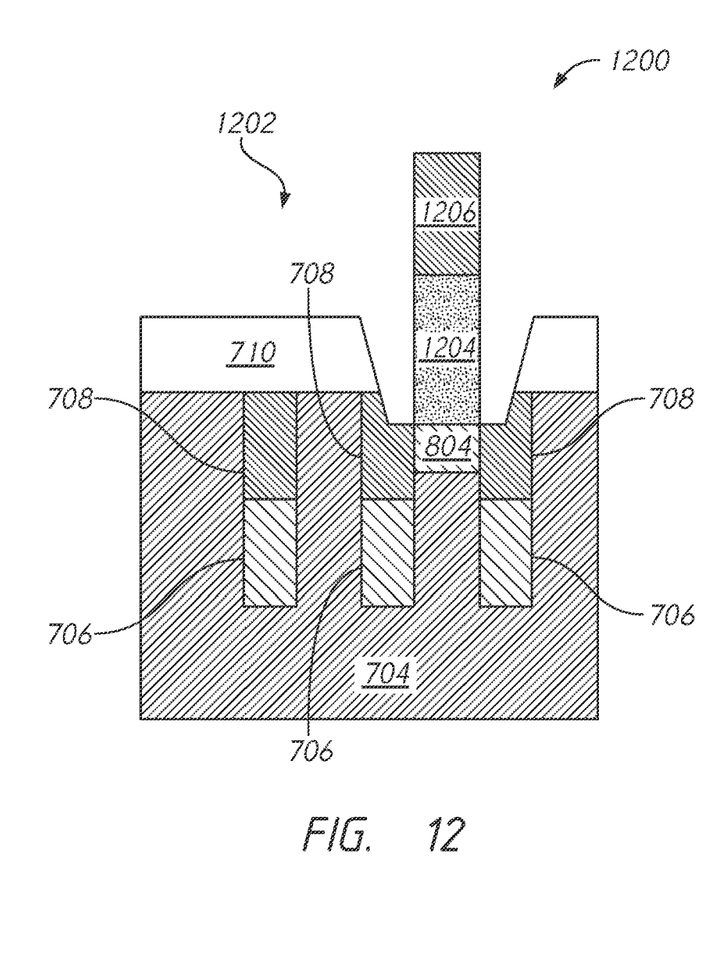
FIG. 12 is a diagram of a vertical cross-sectional view of one schematic structure of a portion of a semiconductor device in accordance with an embodiment of the present disclosure.

FIG. 12 is a diagram of a vertical cross-sectional view of one schematic structure of a portion 1202 of a semiconductor device 1200 in accordance with an embodiment of the present disclosure. After etching the dielectric layer 1104 and the conductive layer 904 not covered by the photoresist 1106, and following removal of the photoresist, a bit line 1204 formed from the conductive layer 904, and a dielectric layer 1206 formed from the 1104 may remain above the bit line contact 804.

Figure 13:
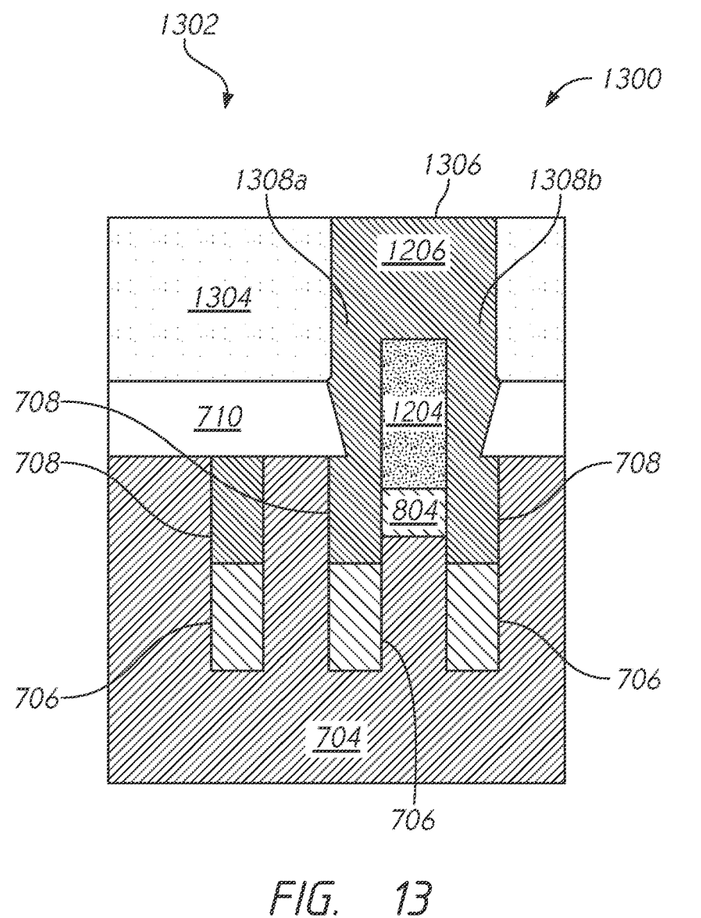
FIG. 13 is a diagram of a vertical cross-sectional view of one schematic structure of a portion of a semiconductor device in accordance with an embodiment of the present disclosure.

FIG. 13 is a diagram of a vertical cross-sectional view of one schematic structure of a portion 1302 of a semiconductor device 1200 in accordance with an embodiment of the present disclosure. The portion 1302 may include one or more dielectric layers 1308a and 1308b above the adjacent dielectric layers 708. The one or more dielectric layers 1308a and 1308b may be disposed on sides of the bit line 1204 in the opening 712 of FIG. 7, and further extending on sides of the dielectric layer 1206 above the bit line 1204. Thus a capacitor insulator 1306 including the one or more dielectric layers 1308a and 1308b and the dielectric layer 1206 may be formed. The capacitor insulator 1306 may insulate the bit line 1204 and the bit line contact 804 from a capacitor (not shown) above the bit line 1204.

The portion 1302 may further include a dielectric layer 1304 above the dielectric layer 710. The dielectric layer 1304 may be formed by depositing a dielectric material on the dielectric layer 710. In some embodiments, the dielectric layer 1304 may include silicon dioxide (SiO2).

Figure 14:
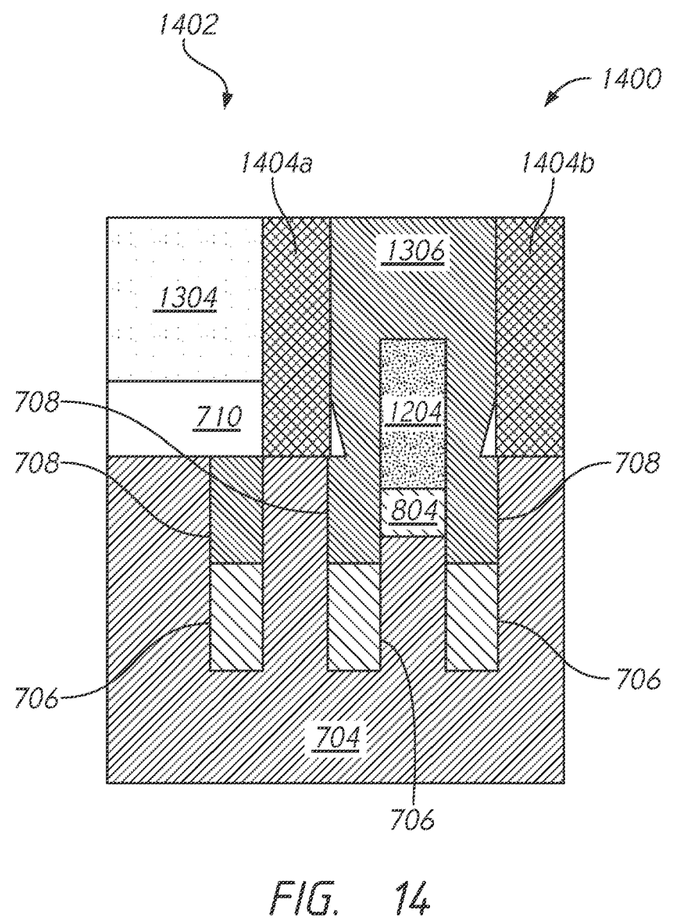
FIG. 14 is a diagram of a vertical cross-sectional view of one schematic structure of a portion of a semiconductor device in accordance with an embodiment of the present disclosure.

FIG. 14 is a diagram of a vertical cross-sectional view of one schematic structure of a portion 1402 of a semiconductor device 1400 in accordance with an embodiment of the present disclosure. In some embodiments, the semiconductor device 1400 may be a memory device (e.g., a dynamic random access memory (DRAM)) including memory cells, for example. Each memory cell may include a transistor and a capacitor. The portion 1402 may include the transistor, such as a metal-oxide-semiconductor field-effect transistor (MOSFET) in the DRAM, for example.

The portion 1402 may include one or more conductive layers 1404a and 1404b above the active region of the substrate 704 on sides of the capacitor insulator 1306. The conductive layers 1404a and 1404b may perform as capacitor contacts that couple the capacitor (not shown) above the capacitor insulator 1306 to the active region (not shown) in the substrate 704.

The word line 706 coupled to a gate of the transistor may function as a control line controlling selection of the memory cell corresponding to the word line 706. One of a source and a drain of the transistor may be coupled to the bit line 1204 through the bit line contact 804 and the other of the source and the drain may be coupled to the capacitor through a capacitor contact, such as either the conductive layer 1404a or the conductive layer 1404b. Data stored as electrical charges may be accumulated in the capacitor.

The conductive layer 904 deposited on a layer with the opening 712 by the PVD or the CVD may have a surface having different height in the opening 712. However, sputtering the conductive layer 904 including conductive material, such as ruthenium, with inert gas, such as Ar gas, a top surface of the conductive layer 904 may be planarized. Thus, a bit line with lower resistance may be formed by the sputtering, compared to the CVD.

Various embodiments of forming conductive layers including conductive material, such as ruthenium, and sputtering the conductive layers with gas including inert gas, such as argon, have been described. Sputtering the conductive layers including the conductive material, such as ruthenium, with the gas including inert gas, such as argon, may reduce unevenness of top surfaces of conductive layers. In some embodiments, the conductive layers may become suitable for forming RDLs or bit lines having superior properties, such as low resistance.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. A method of manufacturing a semiconductor memory device, comprising:
    forming a conductive layer, the conductive layer including:
        a first portion having a top surface having a first height; and
        a second portion having a top surface having a second height lower than the first height;
    sputtering the conductive layer with gas to remove the first portion of the conductive layer and increase the second height of the second portion of the conductive layer concurrently; and
    continuously sputtering the conductive layer with the gas until the first portion is removed while maintaining the second portion.

2. The method of claim 1, wherein the conductive layer is ruthenium.

3. The method of claim 1, wherein forming the conductive layer is performed by a physical vapor deposition method or a chemical vapor deposition method.

4. The method of claim 1, wherein the gas comprises argon.

5. The method of claim 4, wherein the gas further comprises oxygen.

6. A method of manufacturing a semiconductor memory device, comprising:
    forming a conductive layer, the conductive layer including:
        a first portion having a top surface having a first height; and
        a second portion having a top surface having a second height lower than the first height;
    sputtering the conductive layer with gas to remove the first portion of the conductive layer and increase the second height of the second portion of the conductive layer concurrently, the gas comprising argon and oxygen; and
    adjusting a ratio of argon and oxygen to control removing and increasing.

7. A method of manufacturing a semiconductor memory device, comprising:
    forming a conductive layer, the conductive layer including:
        a first portion having a top surface having a first height; and
        a second portion having a top surface having a second height lower than the first height; and
    sputtering the conductive layer with gas to remove the first portion of the conductive layer and increase the second height of the second portion of the conductive layer concurrently, the gas comprising argon and oxygen,
    wherein the semiconductor memory device comprises a memory array region and a peripheral region,
    wherein the conductive layer further comprises a third portion disposed in the peripheral region, and
    wherein the method further comprises:
        forming a dielectric layer above the third portion; and
        sputtering the dielectric layer with the gas to remove a top surface of the dielectric layer concurrently with removing the first portion of the conductive layer and increasing the second height of the second portion of the conductive layer.

8. The method of claim 1, further comprising:
    forming a plurality of dielectric structures and openings between adjacent dielectric structures of the plurality of dielectric structures,
    wherein forming the conductive layer comprises forming the first portion and the second portion of the conductive layer above one dielectric structure of the plurality of dielectric structures and in an opening of the openings respectively.

9. A method of manufacturing a semiconductor memory device, comprising:
    forming a conductive layer, the conductive layer including:
        a first portion having a top surface having a first height; and
        a second portion having a top surface having a second height lower than the first height;
    sputtering the conductive layer with gas to remove the first portion of the conductive layer and increase the second height of the second portion of the conductive layer concurrently; and
    forming a plurality of dielectric structures and openings between adjacent dielectric structures of the plurality of dielectric structures,
    wherein forming the conductive layer comprises forming the first portion and the second portion of the conductive layer above one dielectric structure of the plurality of dielectric structures and in an opening of the openings respectively,
    wherein the plurality of dielectric structures are a plurality of first dielectric structures, and
    wherein the method further comprises:
        forming a second dielectric layer;
        removing the second dielectric layer;
        forming a plurality of interconnects in the second dielectric layer; and
        forming a third dielectric layer including the plurality of first dielectric structures above the second dielectric layer and above the plurality of interconnects.

10. The method of claim 9, wherein forming the plurality of first dielectric structures comprises:
    removing the third dielectric layer above an edge at one side of an interconnect of the plurality of interconnects to form the plurality of first dielectric structures and openings between adjacent first dielectric structures of the plurality of first dielectric structures,
    wherein forming the conductive layer includes:
        depositing the first portion above one first dielectric structure of the plurality of first dielectric structures; and
        depositing the second portion in the opening.

11. The method of claim 10, wherein each first dielectric structure of the plurality of first dielectric structures comprises a top face and a base that has a dimension larger than a dimension of the top face.

12. The method of claim 10, further comprising:
    removing the second dielectric layer and the interconnect of the plurality of interconnects at the edge at the one side of the interconnect of the interconnects to form the opening.

13. An apparatus, comprising:
    a memory cell array region and a peripheral region;
    a first dielectric film disposed across the memory cell array region and the peripheral region;
    a plurality of interconnects in the first dielectric film;
    a plurality of dielectric structures disposed on the first dielectric film, wherein each dielectric structure of at least a portion of the plurality of dielectric structures comprises:
        a first portion above a corresponding interconnect of the plurality of interconnects in the memory cell array region; and
        a second portion above a portion of the first dielectric film between the corresponding interconnect and another interconnect adjacent to the corresponding interconnect of the plurality of interconnects;
    a plurality of second conductive layers above the first dielectric film and above the plurality of corresponding interconnects in the memory cell array region, wherein at least a portion of the plurality of second conductive layers is disposed between adjacent dielectric structures of the plurality of dielectric structures.

14. The apparatus of claim 13, wherein the plurality of second conductive layers include ruthenium.

15. The apparatus of claim 13, wherein the first dielectric film and the plurality of dielectric structures comprise silicon nitride.

16. The apparatus of claim 13, wherein the plurality of interconnects comprise at least one of tungsten, titanium nitride or titanium.

17. The apparatus of claim 13, wherein the plurality of second conductive layers further comprise another portion disposed in the peripheral region, the apparatus further comprising a second dielectric film above the other portion of the plurality of second conductive layers.

18. The apparatus of claim 13, wherein the portion of the plurality of second conductive layers is further disposed at an edge at one side of the corresponding interconnect of the plurality of interconnects.

19. The apparatus of claim 18, wherein each dielectric structure of the plurality of dielectric structures comprises a top face and a base having a dimension larger than a dimension of the top face.

20. A method of manufacturing a semiconductor device comprising:
    forming a plurality of word lines in a substrate;
    forming a dielectric layer on the substrate and on the plurality of word lines;
    removing the dielectric layer and portions of two adjacent word lines of the plurality of word lines and a top portion of the substrate between the two adjacent word lines;
    further removing the top portion of the substrate between the two adjacent word lines;
    forming a bit line contact on the substrate between the two adjacent word lines;
    forming a conductive layer including:
        a first portion above the dielectric layer; and
        a second portion above the portions of the two adjacent word lines and the bit line contact; and
    sputtering the conductive layer with gas to remove the first portion of the conductive layer and increase a height of the second portion of the conductive layer concurrently.

21. The method of claim 20, wherein the dielectric layer is a first dielectric layer, the method further comprising:
    forming a second dielectric layer on the conductive layer;
    providing a mask on the second dielectric layer above the bit line contact;
    removing the second dielectric layer and the conductive layer around the mask to form a bit line including the conductive layer and the second dielectric layer below the mask; and
    removing the mask.

* * * * *